United States Patent [19]

Ohta et al.

[11] Patent Number: 4,875,044

[45] Date of Patent: Oct. 17, 1989

[54] DIGITAL LIMITING CIRCUIT

[75] Inventors: Yoshiyuki Ohta; Taku Kihara, both of Kanagawa, Japan

[73] Assignee: Sony Corporation, Tokyo, Japan

[21] Appl. No.: 127,279

[22] Filed: Dec. 1, 1987

[30] Foreign Application Priority Data

Dec. 9, 1986 [JP] Japan .................................. 61-293277
Mar. 13, 1987 [JP] Japan .................................. 62-058216

[51] Int. Cl.⁴ ............................................ H03M 7/30
[52] U.S. Cl. ........................................ 341/87; 341/95
[58] Field of Search ................... 340/347 DD, 146.2; 364/900 MS File, 200 MS File; 235/310; 341/51, 63, 87, 95, 102

[56] References Cited

U.S. PATENT DOCUMENTS 4,305,063 12/1981 Hanson ....................... 340/347 DD
4,335,372 6/1982 Aufderheide et al. ....... 340/347 DD Primary Examiner—William M. Shoop, Jr.
Assistant Examiner—Brian Young
Attorney, Agent, or Firm—Lewis H. Eslinger; Jay H. Maioli; Donald S. Dowden

[57] ABSTRACT

A digital limiter limits the amplitude of a digital video signal by replacing input data that lies outside the range defined by lower and upper limit levels. Such data are replaced respectively with (1) an average value of (a) the data preceding the first data lying outside the range and (b) the upper or lower limit level data and (2) an average value of (a) the data following the last data lying outside the range and (b) the upper or lower limit level data. This enables a good soft-limit operation without compromising the linearity of the video signal.

7 Claims, 7 Drawing Sheets

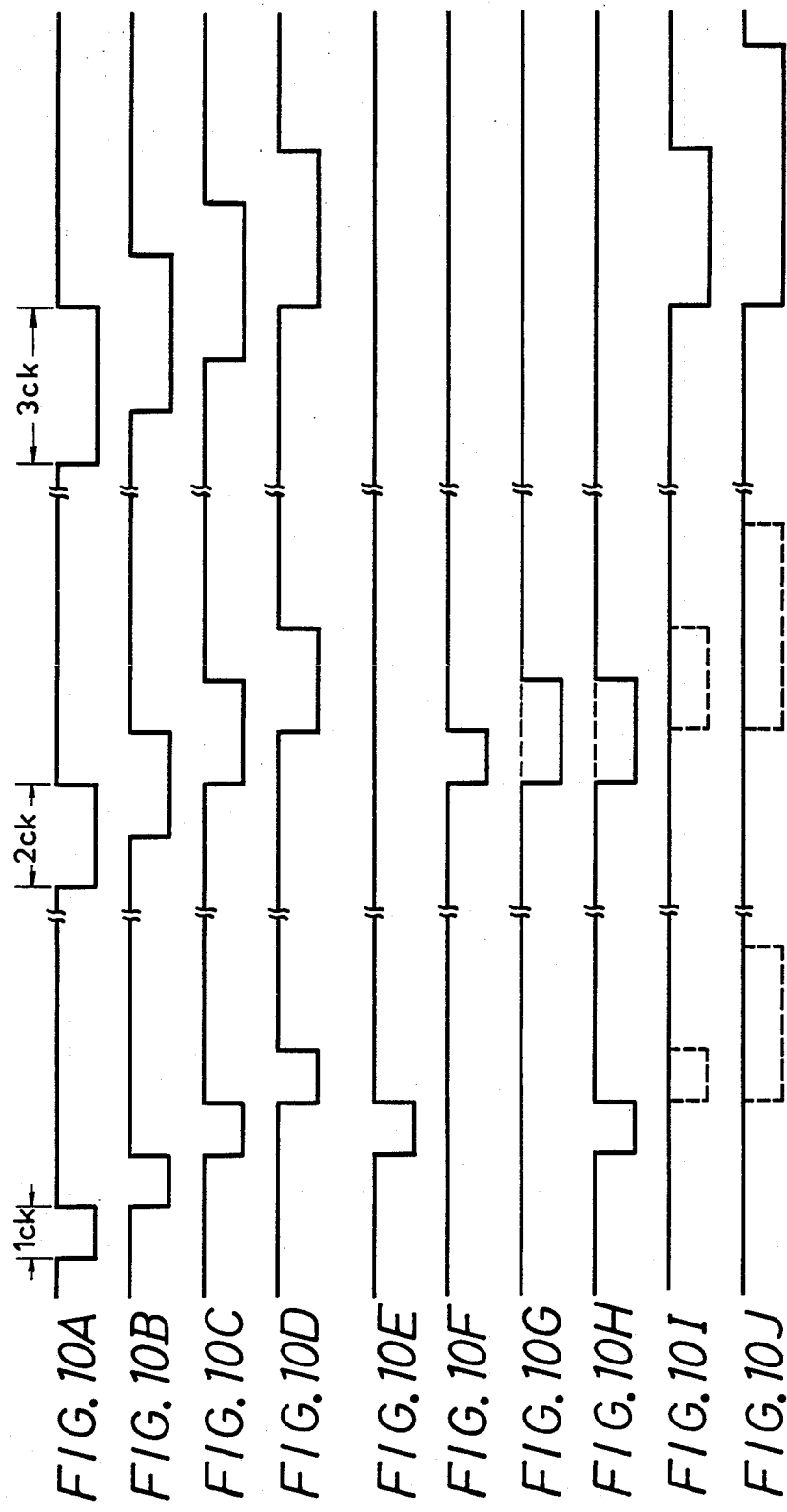

DIGITAL LIMITING CIRCUIT

BACKGROUND OF THE INVENTION

1. Field of the Invention

This invention relates generally to a digital limiter, and more particularly to a digital limiter suitable for use in limiting the amplitude of a video signal with its aperture corrected.

2. Description of the Prior Art

FIG. 1 shows a conventional processing circuit for a video signal supplied, for example, from a video camera. In FIG. 1, an input video signal Si is converted by an A/D converter 31 to be an 8-bit digital signal per one sample. The 8-bit straight binary video signal from the A/D converter 31 is supplied to an adder circuit 32 as well as an aperture correction signal generating circuit 33. An 8-bit offset binary aperture correction signal $S_{AP}$ therefrom is supplied to the adder circuit 32 wherein the aperture correction signal $S_{AP}$ is added to the video signal so as to produce a 9-bit video signal with its edge portions emphasized. In this event, a range of the 8-bit data, for example, from "00" to "FF" (hexadecimal) is assumed to correspond to a range of the 9-bit data from "80" to "180" (hexadecimal). However, the 9-bit video signal produced by adding the aperture correction signal $S_{AP}$ to the 8-bit video signal may be out of the range of "80" to "180". Further, following circuits are designed to process 8-bit data which is equal to the original digital video signal, so that the excess of the data produced by the addition has to be deleted.

For this purpose, the 9-bit video signal from the adder circuit 32 is supplied to a digital limiter 34 wherein the data portion out of the range of "80" to "180" is amplitude-limited so that 8-bit data within the range of "00" to "FF" can be derived therefrom.

The 8-bit video signal from the digital limiter 34 is supplied through, for example, a γ-correction circuit 35 processing 8 bit data to a D/A converter 36 from which an analog video signal So is derived.

The digital limiter 34 of FIG. 1 may be a circuit which performs such limiting operations that data above "180" (hexadecimal) is simply replaced by a maximal 8-bit data i.e. "11111111" and data below "80" is replaced by a minimal 8-bit data "00000000". However, if the signal thus limited is subjected to a digital-to-analog conversion, high frequency components are produced in the outputted analog signal. Further, if an interpolation circuit having zero dimension hold effect is used at the rear stage of the D/A converter, due to the phase rotation caused by the group delay characteristic of the interpolation filter there may be a concern that overshoot or the like will be produced in the output signal if a signal having certain frequency components is supplied thereto.

There may also be considered, as the digital limiter 34 of FIG. 1, an arrangement formed of conversion tables stored, for example, in ROM or the like and having an input/output characteristic (limiter characteristic) as shown in FIG. 2. As can be seen from FIG. 2, the slope of the curve near the upper limit value "FF" in the white direction and the lower limit value "00" in the black direction changes gradually so as to suppress the overshoot and undershoot, which is a defect of the above-mentioned digital limiter, caused by the interpolation filter after digital-to-analog conversion. Thus, a video signal is subjected to a so-called soft limit operation.

However, by the above described arrangement for effecting the soft limit operation, data within the upper and lower limits but near the upper and lower limits are compressed, so that the linearity of the characteristic curve is compromised.

OBJECTS AND SUMMARY OF THE INVENTION

Accordingly, it is an object of the present invention to provide a digital limiter which can eliminate the above-mentioned inconveniences encountered in the prior art and carry out a good soft limit operation.

To achieve the above object, the present invention provides a digital limiting circuit for limiting an input digital signal with n+1 bits, where n is a positive integer, so that an output digital signal with n bits is generated, the limiting circuit comprising:

(a) an input terminal supplied with the input digital signal with n+1 bits;

(b) digital signal level detecting means supplied with the most significant bit and the second most significant bit components of the input digital signal for detecting whether the level L of the input digital signal is within the range expressed below:

$$2^n \leq L < 2^{n+1} + 2^n$$

(c) switching signal generating means supplied with the output of the signal level detecting means for generating a switching signal;

(d) digital signal converting means for converting the input digital signal with n+1 bits into a converted digital signal with n bits;

(e) modified signal generating means for generating a modified signal composed of a digital signal having an extreme value of n bit digital signal and a digital signal having the average value of the extreme value and the converted digital signal; and (f) selecting means controlled by the switching signal and for selecting one of the modified signal and the converted digital signal whereby the output digital signal with n bits is obtained from the selecting means.

These and other objects, features and advantages of the present invention will become apparent from the following detailed description of the preferred embodiment taken in conjunction with the accompanying drawings, throughout which like reference numerals designate like elements and parts.

BRIEF DESCRIPTION OF THE DRAWINGS

FIGS. 10A to 10J are timing charts showing waveforms of signals derived at points A to J in FIG. 9;

DESCRIPTION OF THE PREFERRED EMBODIMENTS

A first embodiment of a digital limiter according to the present invention will hereinafter be described with reference to FIG. 3.

Figure 1:
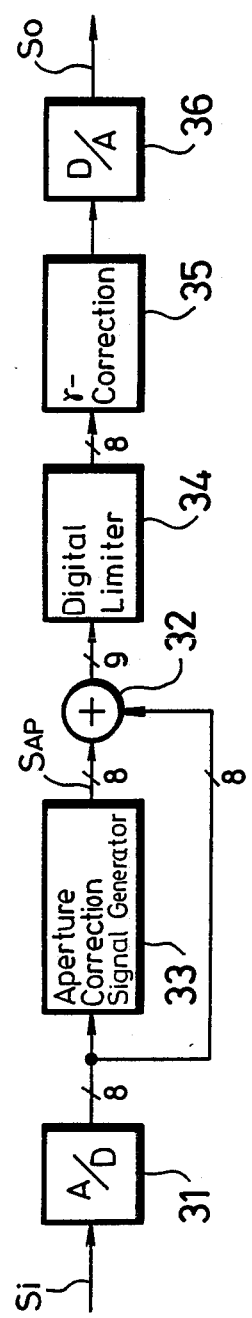
FIG. 1 is a circuit block diagram showing a previously proposed video signal processing circuit.
Figure 2:
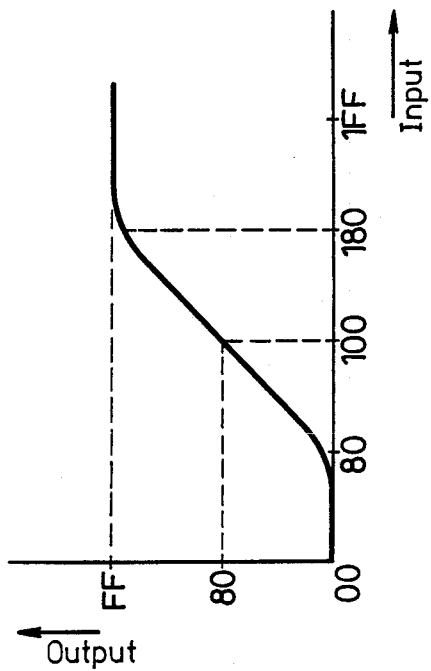
FIG. 2 is a graph showing the input/output characteristic of a digital limiter.
Figure 3:
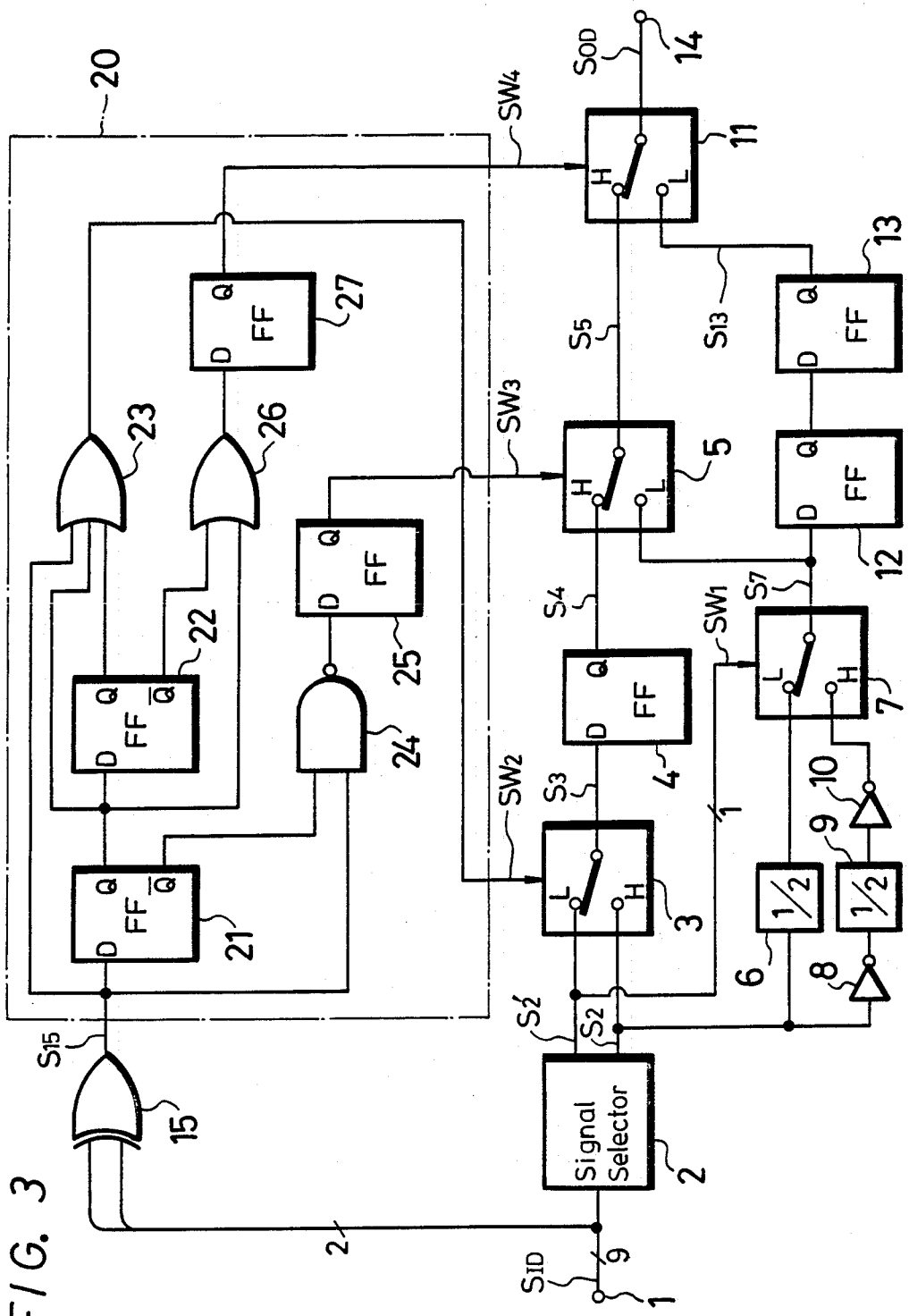
FIG. 3 is a circuit block diagram showing an embodiment of a video signal processing circuit according to the present invention.

In FIG. 3, reference numeral 1 designates an input terminal which is supplied with a 9-bit video signal $S_{ID}$ delivered from, for example, the adder 32 of FIG. 1. Each bit of the video signal $S_{ID}$ supplied to the input terminal 1 is supplied to a terminal D of each of nine D-type flip-flop circuits forming a signal selector 2. From the signals delivered from the output terminals of the flip-flop circuits, the signal selector 2 delivers to one of its output terminals an 8-bit signal $S_2'$ formed of data bits each set to the same value as the value of the most significant bit (MSB), i.e. the bit 9, of the video signal $S_{ID}$, which is supplied to a fixed contact L of a switching circuit 3. The signal $S_2'$ shows a value "11111111" (corresponding to "FF" in hexadecimal) when the MSB of the data of the video signal $S_{ID}$ is at the high level, i.e. "1" and a value "00000000" (corresponding to "00" in hexadecimal) when the MSB of the data of the video signal $S_{ID}$ is at the low level, i.e. "0". In other words, the signal $S_2'$ is set to the maximal or minimal value of 8-bit data in dependence on the value set at the MSB of the video signal $S_{ID}$. The signal selector 2 further delivers to the other one of its output terminals an 8-bit signal $S_2$ consisting of eight data bits which are components of the 9-bit video signal $S_{ID}$ except for its second most significant bit 2SB (the bit 8), which is supplied to a fixed contact H of the switching circuit 3. The signal $S_2$ is converted so that the range of the 9-bit video signal $S_{ID}$ from "80" to "180" (exactly "17F") corresponds to the range of 8-bit data from "00" to "FF". To be specific, "80" to "17F" of 9-bit data can be expressed "010000000" to "101111111" in binary code so that 8 bit data formed of eight bits except for the 2SB of each of the 9-bit data ranges from "00000000" to "11111111", or from "00" to "FF" in hexadecimal.

An output signal $S_3$ from the switching circuit 3 is supplied to a terminal D of a D-type flip-flop 4. Then, a signal $S_4$ delivered to an output terminal Q of the D-type flip-flop 4 is supplied to a fixed contact H of a switching circuit 5.

The signal $S_2$ delivered to the other output terminal of the signal selector 2 is made to have its signal level reduced to half by a level adjuster 6 and thereafter is supplied to a fixed contact L of a switching circuit 7. The signal $S_2$ is also supplied through an inverter 8 to a level adjuster 9 which reduces the level of the signal $S_2$ to half. Then, the signal $S_2$ with the half level is supplied through an inverter 10 to a fixed contact H of the switching circuit 7. The switching circuit 7 is also supplied with the low or high level of the signal $S_2'$, as a change-over signal $SW_1$, which is delivered to the one output terminal of the signal selector 2. The switching circuit 7 is changed over to be connected to its contact H when the signal $S_2'$ shows the high level "1" and to its contact L when the signal $S_2'$ shows the low level "0", respectively.

When the MSB (the bit 9) of the video signal $S_{ID}$ is at the low level "0", the change-over signal $SW_1$ is also set to the low level "0", so that the switching circuit 7 is connected to the contact L. Consequently, the switching circuit 7 outputs a signal $S_7$ which is equal to the signal having its level equal to the half of the signal $S_2$, that is, data indicative of an average value of the lower limit value "00000000" ("00" in hexadecimal) of 8-bit data and the signal $S_2$.

On the other hand, when the MSB (the bit 9) of the video signal $S_{ID}$ is at the high level "1", the change-over signal $SW_1$ is also set to the high level "1", so that the switching circuit 7 is connected to the contact H. Consequently, the switching circuit 7 outputs the signal $S_7$ which is provided by inverting the signal $S_2$, reducing its level to half, and again inverting the same, that is, data indicative of an average value of the upper limit value "11111111" ("FF" in hexadecimal) and the signal $S_2$.

The output signal $S_7$ from the switching circuit 7 is supplied to a fixed contact L of the switching circuit 5. An output signal $S_5$ from the switching circuit 5 is supplied to a fixed contact H of a switching circuit 11.

The output signal $S_7$ from the switching circuit 7 is also supplied to a terminal D of a D-type flip-flop circuit 12. The signal developed at an output terminal Q of the flip-flop circuit 12 is supplied to a terminal D of a flip-flop circuit 13. A signal $S_{13}$ delivered to an output terminal Q of the flip-flop circuit 13 is next supplied to a fixed contact L of the switching circuit 11. An output signal from the switching circuit 11 is delivered to an output terminal 14 as an output video signal $S_{OD}$.

The MSB (the bit 9) and 2SB (the bit 8) data of the video signal $S_{ID}$ fed to the terminal 1 are supplied to an exclusive OR circuit (hereinafter simply referred to as an EX-OR circuit) 15. An output signal $S_{15}$ from the EX-0R circuit 15 becomes the high level "1" when the video signal $S_{ID}$ satisfies the relationship "010000000" $\leq S_{ID} <$ "110000000" ("80" $\leq S_{ID} <$ "180" in hexadecimal), and the low level "0" when the signal $S_{ID}$ does not satisfy the above relationship.

The output signal $S_{15}$ from the EX-OR circuit 15 is supplied to a terminal D of a D-type flip-flop 21 forming a change-over signal generating circuit 20. A signal delivered to an output terminal Q of the flip-flop circuit 21 is supplied to a terminal D of a D-type flip-flop circuit 22. The output signal $S_{15}$ from the EX-OR circuit 15 and signals delivered to the respective terminals Q of the flip-flop circuits 21 and 22 are supplied to an OR circuit 23 whose output signal is supplied to the switching circuit 3 as a change-over signal $SW_2$. The switching circuit 3 is connected to the contact H when the change-over signal $SW_2$ is at the high level "1" and to the contact L when the change-over signal $SW_2$ is at the low level "0".

The output signal $S_{15}$ from the EX-OR circuit 15 and a signal delivered to an inverting output terminal $\overline{Q}$ of the flip-flop circuit 21 are both supplied to a NAND circuit 24. The output signal from the NAND circuit 24 is supplied to a terminal D of a D-type flip-flop circuit 25 which delivers to its output terminal Q a signal which is supplied to the switching circuit 5 as the change-over signal $SW_3$. The switching circuit 5 is connected to the contact H when the change-over signal $SW_3$ is at the high level "1" and to the contact L when the change-over signal $SW_3$ is at the low level "0".

A signal delivered to an output terminal Q of the flip-flop circuit 21 and a signal delivered to an inverting output terminal $\overline{Q}$ of the flip-flop circuit 22 are both supplied to an OR circuit 26. The output signal from the OR circuit 26 is supplied to a terminal D of a D-type flip-flop circuit 27. A signal delivered to an output terminal Q of the flip-flop circuit 27 is supplied to the switching circuit 11 as a change-over signal $SW_4$. Thus, the switching circuit 11 is connected to the contact H when the change-over signal $SW_4$ is at the high level "1" and to the contact L when the change-over signal $SW_4$ is at the low level "0".

Figure 4:
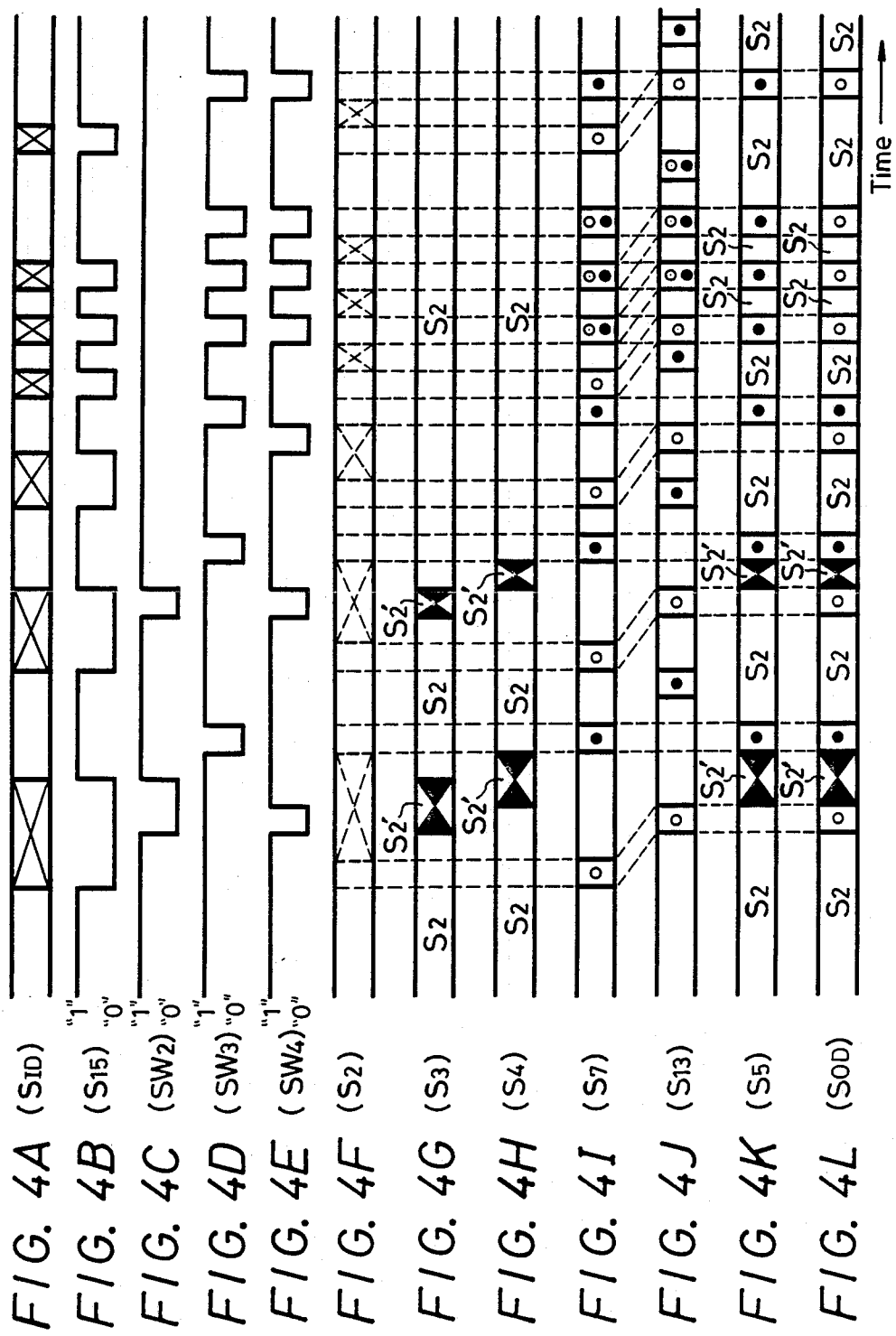
FIGS. 4A to 4L are timing charts showing how an input signal is processed by the circuit of FIG. 3.

Let there now be considered a case where the video signal $S_{ID}$ as shown in FIG. 4A is supplied to the input terminal 1 of the video signal processing circuit constructed as described above.

First, it is assumed that portions indicated by "x" in the signal $S_{ID}$ of FIG. 4A are those which do not comply with the relationship "010000000" $\leq S_{ID} <$ "0000000" ("80" $< S_{ID} <$ "180" in hexadecimal) and are subjected to the amplitude limitation as amplitude-limited portions. Then, the output signal $S_{15}$ of the EX-OR circuit 15 becomes the low level "0" in response to the portions indicated by "x" of the signal $S_{ID}$ and the high level "1" in response to the other portions of the same, as shown in FIG. 4B. Consequently, the change-over signal $SW_2$ supplied from the OR circuit 23 to the switching circuit 3 is made as shown in FIG. 4C, the change-over signal $SW_3$ supplied from the flip-flop circuit 25 to the switching circuit 5 as shown in FIG. 4D, and the change-over signal $SW_4$ supplied from the flip-flop circuit 27 to the switching circuit 11 as shown in FIG. 4E, respectively.

The signal $S_2$ delivered to one output terminal of the signal selector 2 has the same waveform as the video signal $S_{ID}$, but is delayed by one clock pulse from the video signal $S_{ID}$, as shown in FIG. 4F. In FIG. 4F, portions indicated by broken "x" correspond to the amplitude limited portions of the video signal $S_{ID}$.

Since the switching circuit 3 is connected to the contact H when the change-over signal $SW_2$ is at the high level "1" and to the contact L when the change-over signal $SW_2$ is at the low level "0", the output signal $S_3$ from the switching circuit 3 is as shown in FIG. 4G. Specifically, the output signal $S_3$ is equal to the signal $S_2$ when the change-over signal $SW_2$ is at the high level "1" and to the signal $S_2'$ when the change-over signal $SW_2$ is at the low level "0".

The output signal $S_4$ delivered to the output terminal Q of the flip-flop circuit 4 has the same waveform as the output signal $S_3$ from the switching circuit 3, but is delayed by one clock from the signal $S_3$, as shown in FIG. 4H.

As described above, the output signal $S_7$ from the switching circuit 7 shows an average value data of the lower extreme value of 8-bit data "00000000" ("00" in hexadecimal) and the signal $S_2$ when the MSB (the bit 9) of the video signal $S_{ID}$ is at the low level "0" and an average value data of the upper extreme value of 8-bit data "11111111" ("FF" in hexadecimal) and the signal $S_2$ when the MSB (the bit 9) of the video signal $S_{ID}$ is at the high level "1".

In FIG. 4I, portions indicated by the mark " " shows the average value data immediately preceding the amplitude limited portions of the video signal $S_{ID}$, and portions indicated by the mark " " the average value data immediately following same.

The signal $S_{13}$ delivered to the output terminal Q of the flip-flop circuit 13 has the same waveform as the output signal $S_7$ from the switching circuit 7, but is delayed by two clock periods as shown in FIG. 4J.

Since the switching circuit 5 is connected to the contact H when the change-over signal $SW_3$ is at the high level "1" and to the contact L when the change-over signal $SW_3$ is at the low level "0", the output signal $S_5$ from the switching circuit 5 is as shown in FIG. 4K. Specifically, the output signal $S_5$ is equal to the signal $S_4$ when the change-over signal $SW_3$ is at the high level "1" and to the signal $S_7$ when the change-over signal $SW_3$ is at the low level "0".

Since the switching circuit 11 is connected to the contact H when the change-over signal $SW_4$ is at the high level "1" and to the contact L when the change-over signal $SW_4$ is at the low level "0", the video signal $S_{OD}$ delivered from the switching circuit 11 to the output terminal 14 is as shown in FIG. 4L. Specifically, the video signal $S_{OD}$ is equal to the signal $S_5$ when the change-over signal $SW_4$ is at the high level "1" and to the signal $S_{13}$ when the change-over signal $SW_4$ is at the low level "0".

The output video signal $S_{OD}$ in FIG. 4L shows that only its portions corresponding to the amplitude-limited portions of the input video signal $S_{ID}$ are limited in their amplitude. In this event, an amplitude limited portion which contains more than three successive data has its first data replaced by an average data (indicated by the symbol " " in the drawing) of the preceding data thereof and the limit level data, the last data replaced by an average data (indicated by the symbol " " of the following data thereof and the limit level data, and data located between the first and last data replaced by the limit level data (indicated by the symbol " ". An amplitude limited portion which contains two successive data has its first data replaced by an average data of the preceding data thereof and the limit level data and the last data replaced by an average data of the following data thereof and the limit level data. An amplitude limited portion which contains only one data has the data replaced by an average data of the preceding data thereof and the limit level data.

Figure 5:
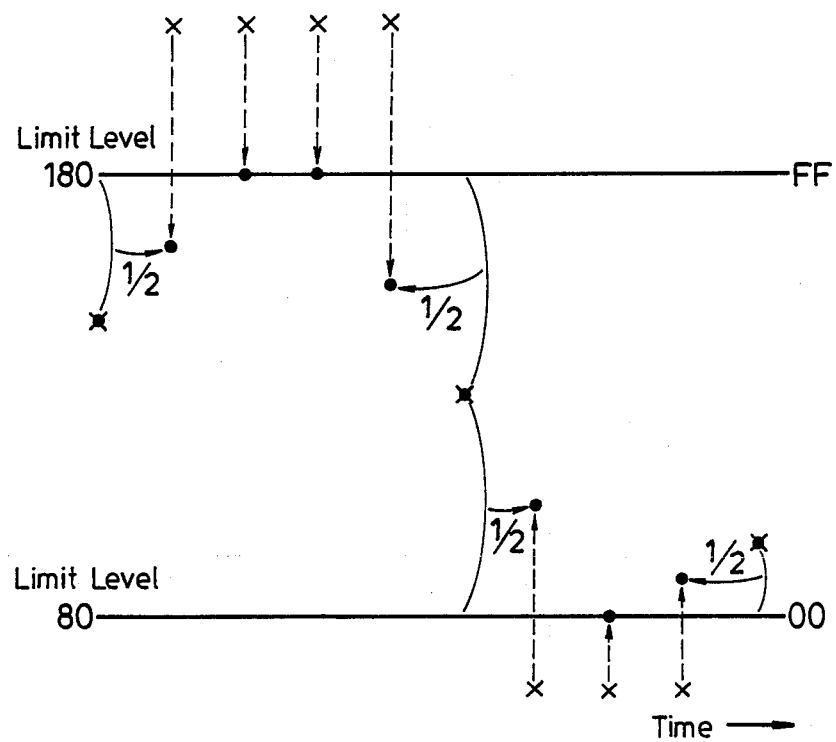
FIG. 5 is a diagram showing how over data is modified.

According to the present embodiment of the invention as described above, the first and last data which exceed the limit levels (data which is out of the range between "80" and "180" as to the input video signal $S_{ID}$, and the range between "00" and "FF" as to the signal $S_2$ which has been converted into an 8-bit converted signal) are replaced by the average data of the preceding data thereof and the limit level data and the average data of the following data thereof and the limit level data, respectively, that is, the data are "soft-limited". Referring to FIG. 5, if the data before executing the amplitude-limiting is indicated by "x", it is replaced by data indicated by " ", that is, the data is amplitude-limited or soft-limited. Data which lies within the range between the upper and lower limit levels is not subjected to amplitude-limiting, so that an inconvenience of compromised linearity, inherent to the prior art, can be eliminated.

In the above embodiment, the amplitude-limited portion which contains only one over data has the data replaced by an average data of the preceding data thereof and the limit level data. Alternatively, the data may be replaced by an average data of the following data thereof and the limit level data.

The above embodiment is described for the case where the 9-bit video signal $S_{ID}$ is inputted and the 8-bit video signal $S_{OD}$ is outputted. The present invention can generally be applied to the case where an (n+1) bit video signal is inputted and an n bit video signal is outputted.

Next, a second embodiment of the present invention will hereinafter be described with reference to FIGS. 6 to 10.

Figure 6:
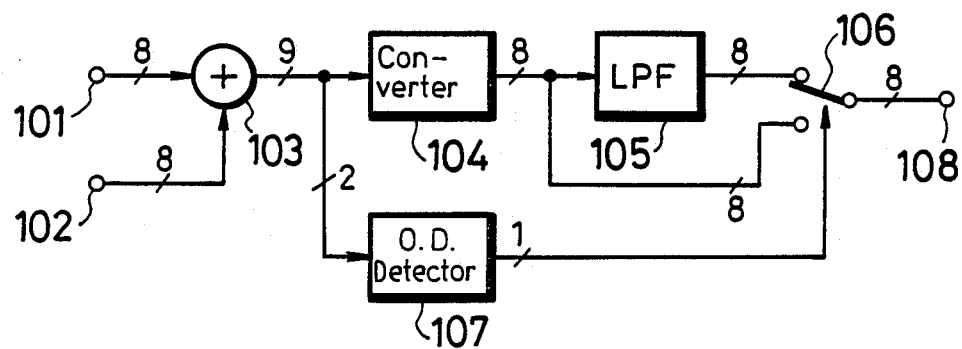
FIG. 6 is a circuit block diagram showing a second embodiment of the present invention.

FIG. 6 shows a block diagram showing the principle of the second embodiment. A digital video signal, formed e.g. of eight bits, supplied to an input terminal 101 and an 8-bit aperture correcting signal supplied to an input terminal 102 are added to each other by an adder circuit 103. The signal produced by the addition becomes a 9-bit signal and supplied to a converter 104. If the 9-bit additive signal exceeds "180" in hexadecimal or becomes below "80" in hexadecimal, it is limited in a manner that the signal above "180" is replaced with the maximal value of 8-bit data ("11111111") and the signal below "80" is replaced with the minimal data of 8-bit data ("00000000"). It is therefore possible to employ a known limiter as the converter 104. The output signal from the converter 104 is supplied through a digital low-pass filter 105 to one input terminal of a selector 106 as well as directly to the other input terminal of the selector 106.

The 9-bit signal from the adder circuit 103 is further supplied to a detector 107 for detecting that the 9-bit signal is above "180" or below "80" in hexadecimal (over data or O.D.) and outputting a detecting signal if the above condition is detected. The selector 106, when it is supplied with the detecting signal from the over data detector 107, is changed over to a contact which is connected to the low pass filter 105 and delivers the selected signal to an output terminal 108.

Figure 7:
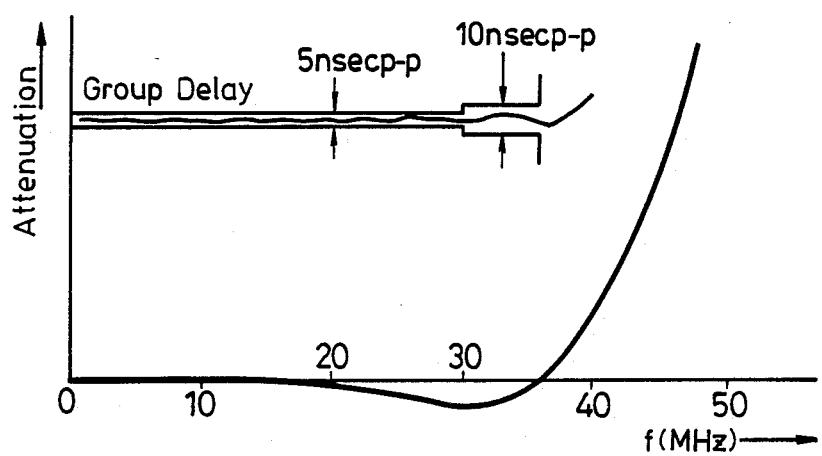
FIG. 7 is a graph showing characteristics (attenuation and delay characteristics) of an interpolation filter.

The circuit arrangement of FIG. 6 is provided, though not shown, with e.g. a γ-correction circuit, in case of handling an 8-bit data, at the rear stage of the output terminal 108 and a digital to analog (D/A) converter at the rear stage of the γ-correction circuit, which are the same as those designated by the reference numerals 35 and 36 in FIG. 1, respectively. Further in the rear stage of the D/A converter there is provided an interpolation filter (not shown) which has attenuation and group delay characteristics as shown in FIG. 7. In the above circuit arrangement, the low pass filter 105 should be made to have a filtering characteristic as shown by a solid line curve a in FIG. 8.

Signal components between 30 and 48 MHz, which will cause overshoot and so on to occur in the interpolation filter, are attenuated by the low pass filter 105 so that such trouble will not occur even if this signal is supplied to the interpolation circuit.

In this case, if the input signal is always passed through the low pass filter 105, the linearity of the signal would be damaged. However, since the selector 106 selects the signal from the low pass filter 105 only during periods in which the detector 107 detects the over data, while in the normal state the signal from the converter 104 is directly delivered to the output terminal 108.

Thus, a signal which causes the over data by the addition is limited to the 8-bit data and delivered to the output terminal 108. In addition, overshoot components produced by the phase characteristic of the interpolation filter are attenuated by the low pass filter 105. Also the signal from the converter 104 passes the low pass filter 105 when the signal generates the over data while bypasses the same when the signal is within the range, so that the linearity is not damaged in normal conditions and accordingly an appropriate signal processing can be always carried out.

Figure 8:
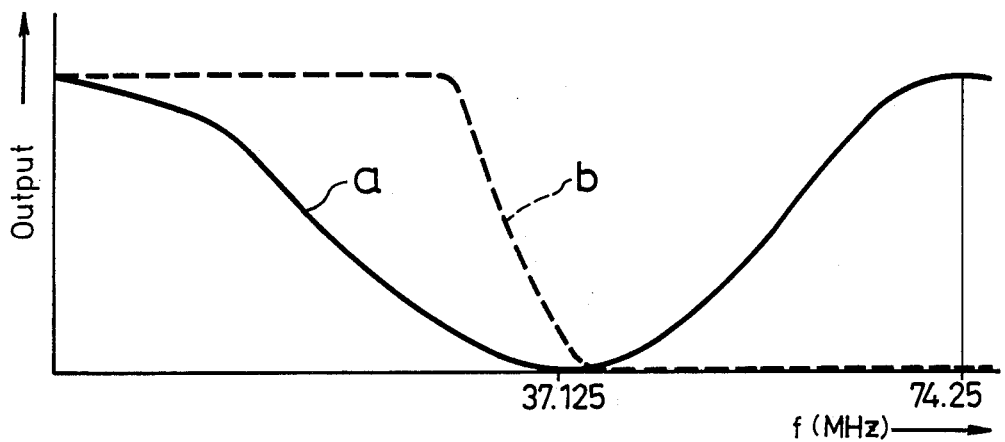
FIG. 8 is a graph showing characteristics (frequency characteristic) of a low pass filter.

If the low pass filter 105 has a characteristic as shown by a broken line curve b in FIG. 8, the signal from the converter 104 may be always supplied to the low pass filter 105, regardless of the signal condition. However, it is extremely difficult to obtain such a characteristic by a digital low pass filter.

Figure 9:
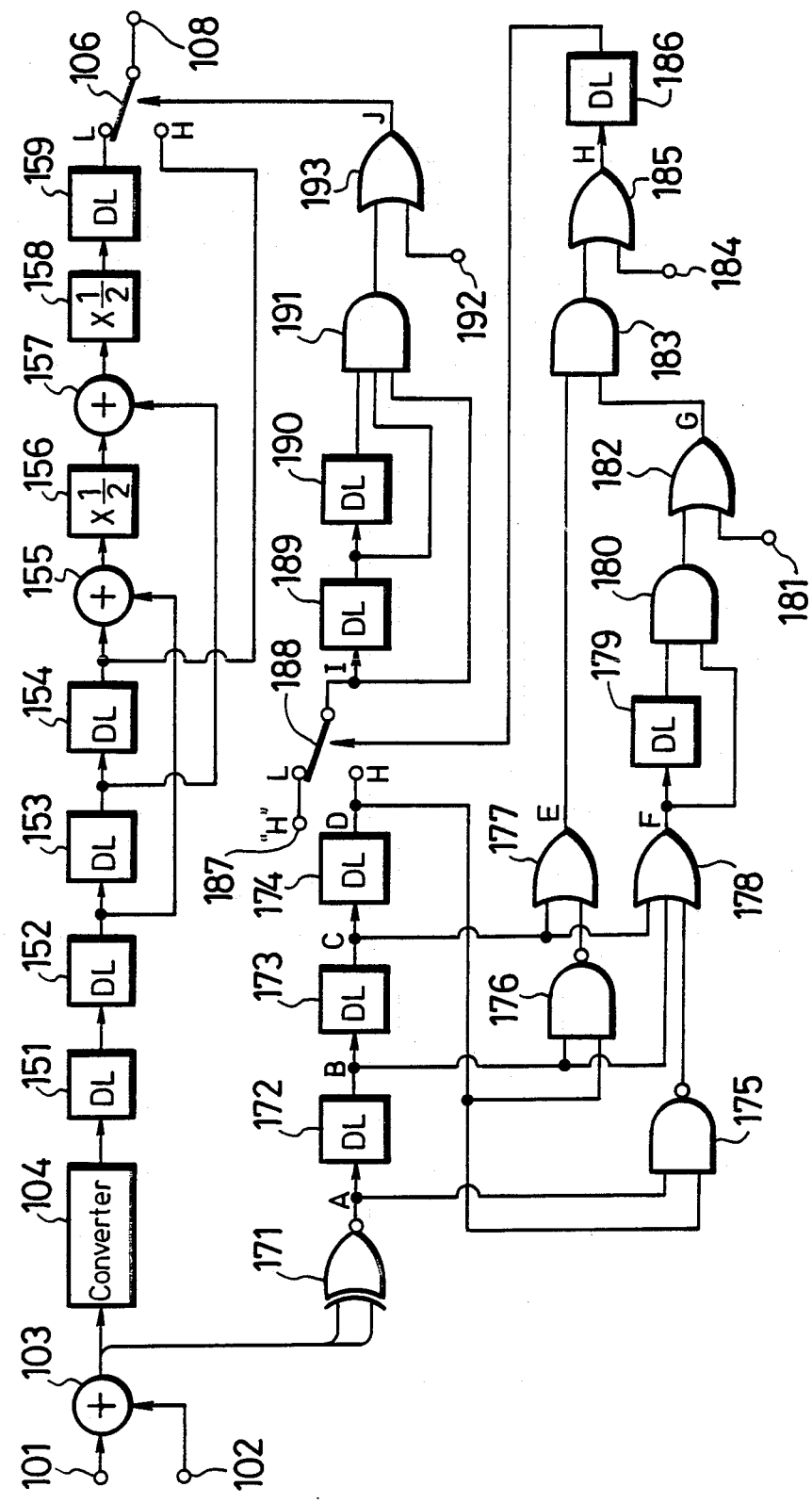
FIG. 9 is a circuit block diagram specifically showing a practical circuit of the second embodiment shown in FIG. 6.

FIG. 9 shows a practical circuit arrangement of the second embodiment.

In FIG. 9, the signal from the converter 104 is supplied to an adder circuit 155 through a serial circuit formed of delay (DL) circuits 151 to 154 which delay a signal inputted thereto by one clock period. The output signal from the adder circuit 155 is supplied to an adder circuit 157 through a multiplier circuit 156 (which may be formed of a simple bit shift circuits, specifically) which multiplies the signal supplied thereto by ½. The output signal from the delay circuit 152 is further supplied to the adder circuit 155, and the output signal from the delay circuit 153 to the adder circuit 157. The output signal from the adder circuit 157 is supplied to a multiplier circuit 158 which multiplies the signal inputted thereto by ½. The output signal from the multiplier 158 is next supplied to a delay circuit 159 which delays a signal inputted thereto by one clock period. The digital low pass filter 105 shown in FIG. 6 is formed of these circuits 153 to 159. Specifically, the low pass filter 105 is constructed such that the output signals from the delay circuits 152, 153 and 154 are multiplied by coefficients with weight of 1:2:1, respectively, and then added. The selector 106 is supplied with the output signal from the delay circuit 159 at one of its input terminal L and the output signal from the delay circuit 154 at its other input terminal H. Thus, the output signal line from the low pass filter 105 is provided with the delay circuit 159 while the signal line bypassing the low pass filter 105 is not provided with a delay circuit, so that it can be equivalently thought that the signal bypassing the low pass filter 105, that is, the signal supplied to the contact H of the selector 106, is taken out from the connecting point between the delay circuits 153 and 154. Also, it can be thought that the output signal from the low pass filter 105 is an average of the signal at the connecting point between the delay circuits 153 and 154 and each one sample signal preceding and following the signal at the connecting point.

As described above, only when the input signal becomes the over data, the output from the low pass filter 105 is selected, and upon the occurrence of the over data, such data is replaced by the maximal or minimal value ("11111111" or "00000000") of 8-bit data is supplied to the low pass filter 105. Accordingly, the signal derived at the output terminal of the low pass filter 105 is an average value of the maximal or minimal value of 8-bit data and the preceding and following samples thereof.

The most significant two bits from the adder circuit 103 are supplied to an EX-OR circuit 171 for detecting the over data period, which is the same object as the EX-OR circuit 15 in FIG. 3. The output signal from the EX-OR circuit 171, that is, the over data detecting signal is supplied to a serial circuit formed of delay circuits 172 to 174 for delaying an input signal by one clock period. The output signal from the delay circuit 174 and the output signal from the EX-OR circuit 171 are supplied to a NAND circuit 175 while the output signals from the delay circuits 172 and 174 are supplied to a NAND circuit 176. Further, the output signal from the delay circuit 173 and the output signal from the NAND circuit 176 are supplied to an OR circuit 177, and the output signals from the delay circuits 172 and 173 and the output signal from the NAND circuit 175 are supplied to an OR circuit 178. The output signal from the OR circuit 178 is supplied to a delay circuit 179 for delaying an input signal by one clock period. The output signal from the delay circuit 179 and the output signal from the OR circuit 178 are supplied to an AND circuit 180. The output signal from the AND circuit 180 and a signal from a terminal 181 are supplied to an OR circuit 182. The output signals from the OR circuits 182 and 177 are supplied to an AND circuit 183. The output signal from the AND circuit 183 and a signal from a terminal 184 are supplied to an OR circuit 185. The output signal from the OR circuit 185 is supplied to a delay circuit 186 for delaying an input signal by one clock period, the output signal of which is used to change over a selector 188 to be selectively connected with a contact H to which the output signal from the delay circuit 174 is fed and a contact L to which the high level signal "H" is fed from a terminal 187.

The signal selected by the selector 188 is supplied to a serial circuit formed of delay circuits 189 and 190 with the delay time of one clock period. The signal from the selector 188 and the output signals from the delay circuits 189 and 190 are all supplied to an AND circuit 191. Then, the output signal from the AND circuit 191 and a signal from a terminal 192 are supplied to an OR circuit 193 whose output signal is used to control the selector 106.

Let it now be explained the operations of the changeover signal generating circuit formed of the circuits 171 to 193, assuming a case where the 9-bit digital signal from the adder circuit 103 becomes the over data for one, two and three clock periods, successively, and the output signal from the EX-OR circuit 171 is made as shown in FIG. 10A. The signal shown in FIG. 10A, that is, the output signal from the EX-OR circuit 171 is made as signals at points B to J in the block circuit diagram of FIG. 9 as shown in FIGS. 10B to 10J, respectively.

The selector 106 is controlled by the signal shown in FIG. 10J such that the signal bypassing the low pass filter is selected when this signal is at the high level, and the signal outputted from the low pass filter is selected when the signal is at the low level.

In FIGS. 10G to 10J, waveforms indicated by solid lines are derived when the signals supplied to the terminals 181, 184 and 192 are all at the low level. Thus, when the over data is derived continuously for more than three clock periods, the selector 106 selects the signal from the low pass filter.

As can be understood from FIG. 10J, the low level signal continues for five clock periods and corresponds to the signal shown in FIG. 10A which shows that the over data continues for three clock periods. Therefore, the signal from the low pass filter is selected for the five clock periods comprising each one clock period preceding and following the three clock periods of the over data. As is clear from the comparison of FIG. 10A and FIG. 10J, the intermediate three clock periods of the five clock low level periods of FIG. 10J is delayed by four clock periods from the three clock periods of FIG. 10A. This is effected to synchronize the intermediate three clock periods with the output signal from the converter 104 which is delayed by four clock periods by the delay circuits 151, 152, 153 and 154 or 151, 152, 153 and 159.

Incidentally, it may come out better to reduce periods in which the linearity is damaged by tolerating a minor overshoot.

Therefore, in the circuit arrangement shown in FIG. 9, when the terminal 192 is supplied with the high level "H" signal, the low pass filter 105 is always bypassed. While, when the terminals 192 and 184 are supplied respectively with the low level "L" and high level "H" signals, respectively, if the over data is detected only for one clock period, the output signal from the low pass filter 105 is selected for three clock periods comprising each one clock period preceding and following the over data period. When, on the contrary, the terminals 184 and 192 are supplied with the low level "L" signal and the terminal 181 with the high level "H" signal, if the over data is detected for successive two clock periods, the output signal from the low pass filter 105 is selected.

According to the second embodiment of the present invention as described above, overshoot components produced by the phase characteristic of the interpolation filter are attenuated by the filter circuit, and the filter circuit is used with the signal when the over data is detected and bypassed when it is not detected. Accordingly, the linearity is not damaged in normal conditions, so that signal processing can be always carried out satisfactorily.

Furthermore, the first and last data which exceed the range between the lower and upper limit levels are replaced respectively with an average value of the data preceding the first over data and the upper or lower imit level data and an average value of the data following the last over data and the upper or lower limit level data, to thereby enable a good soft-limit operation without damaging the linearity.

The above description is given on the preferred embodiments of the invention but it will be apparent that many modifications and variations could be effected by one skilled in the art without departing from the spirit or scope of the novel concepts of the invention so that the scope of the invention should be determined by the appended claims only.

We claim as our invention:

1. A digital limiting circuit for limiting an input digital signal with n+1 bits, where n is a positive integer, so that an output digital signal with n bits is generated, said limiting circuit comprising:

an input terminal supplied with the input digital signal with n+1 bits;

digital signal level detecting means supplied with the most significant bit and the second most significant bit of said input digital signal for detecting whether the level L of said input digital signal is within the range $$2^n \leq L < 2^{n+1} + 2^n;$$

switching signal generating means supplied with the output of said signal level detecting means for generating a switching signal;

digital signal converting means for converting said input digital signal with n+1 bits into a converted digital signal with n bits;

modified signal generating means for generating a modified signal composed of a digital signal having an extreme value of an n bit digital signal and a digital signal having the average value of said extreme value and said converted digital signal, where said extreme value is the lowest or highest value or to be represented in said output signal; and selecting means controlled by said switching signal and for selecting said modified signal or said converted digital signal, whereby said output digital signal with n bits is obtained from said selecting means.

2. A digital limiting circuit according to claim 1, wherein said digital signal level detecting means includes an exclusive-OR gate means connected to receive the two most significant bits of said input digital signal.

3. A digital limiting circuit according to claim 1, wherein said digital signal converting means includes a bit selector for selecting n bits of said input digital signal except for the second most significant bit thereof.

4. A digital limiting circuit according to claim 3, wherein said modified signal generating means includes a first multiplier for multiplying said converted digital signal by $\frac{1}{2}$, a first inverter for inverting said converted digital signal, a second multiplier for multiplying the output of said first inverter by $\frac{1}{2}$, a second inverter for inverting the output of said second multiplier, and a selector for selecting one of the outputs of said first multiplier and said second inverter by the most significant bit of said input digital signal.

5. A digital limiting circuit according to claim 1, wherein said digital signal converting means includes a bit converter for converting a digital signal having the level between $2^n$ and $2^{n+1}+2^n$ to said converted digital signal with n bits, for converting a digital signal having a level smaller than $2^n$ to a minimum value of the n bit digital signal, and for converting a digital signal having a level larger than $2^{n+1}+2^n$ to a maximum value of the n bit digital signal.

6. A digital limiting circuit according to claim 5, wherein said modified signal generating means includes a digital low pass filter means supplied with said converted digital signal and for generating the modified signal.

7. A digital limiting circuit according to claim 6, wherein said digital low pass filter means includes first and second delay circuits, each of said delay circuits delaying an input signal by one clock period of said input digital signal, and adding means for adding the input signal of said first delay circuit, the input signal of said second delay circuit, and the output of said second delay circuit with a ratio of 1:2:1, whereby the modified signal is obtained at the output of said adding means.

* * * * *